(12) United States Patent
Kim et al.

(10) Patent No.: US 8,114,733 B2
(45) Date of Patent: Feb. 14, 2012

(54) SEMICONDUCTOR DEVICE FOR PREVENTING THE LEANING OF STORAGE NODES AND METHOD FOR MANUFACTURING THE SAME

(75) Inventors: Hun Kim, Seoul (KR); Byung Soo Eun, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 13/173,394

(22) Filed: Jun. 30, 2011

(65) Prior Publication Data

US 2011/0256696 A1    Oct. 20, 2011

Related U.S. Application Data

(62) Division of application No. 12/169,708, filed on Jul. 9, 2008, now Pat. No. 7,994,561.

(30) Foreign Application Priority Data

Apr. 29, 2008   (KR) ........................ 10-2008-0039941

(51) Int. Cl.
    *H01L 21/8242*    (2006.01)
(52) U.S. Cl. .................... 438/243; 438/386; 438/618
(58) Field of Classification Search .................. 438/243, 438/244, 386, 387, 391, 618, 622, 639
    See application file for complete search history.

(56) References Cited

U.S. PATENT DOCUMENTS

| 6,091,094 | A | 7/2000 | Rupp |
| 6,177,351 | B1 | 1/2001 | Beratan et al. |
| 6,411,492 | B1 | 6/2002 | Kar-Roy et al. |
| 6,461,911 | B2 | 10/2002 | Ahn et al. |
| 6,465,351 | B1 | 10/2002 | Jeong |
| 6,500,763 | B2 | 12/2002 | Kim et al. |
| 6,656,790 | B2 | 12/2003 | Jang et al. |
| 6,784,479 | B2 | 8/2004 | Park |
| 6,809,363 | B2 | 10/2004 | Yu et al. |
| 6,818,551 | B2 | 11/2004 | Jin et al. |
| 6,867,094 | B2 | 3/2005 | Park |
| 6,914,286 | B2 | 7/2005 | Park |
| 6,991,980 | B2 | 1/2006 | Park |
| 7,084,448 | B2 | 8/2006 | DeBoer et al. |
| 7,094,660 | B2 | 8/2006 | Park |
| 7,098,497 | B2 | 8/2006 | Fukuzumi |

(Continued)

FOREIGN PATENT DOCUMENTS

KR    1020050000896 A    1/2005

(Continued)

OTHER PUBLICATIONS

USPTO OA mailed Mar. 3, 2010 in connection with U.S. Appl. No. 12/169,708.

(Continued)

*Primary Examiner* — Kevin M Picardat
(74) *Attorney, Agent, or Firm* — Ladas & Parry LLP

(57) ABSTRACT

A semiconductor device for preventing the leaning of storage nodes and a method of manufacturing the same is described. The semiconductor device includes support patterns that are formed to support a plurality of cylinder type storage nodes. The support patterns are formed of a BN layer and have a hexagonal structure. The BN layer forming the support patterns has compressive stress as opposed to tensile stress and can therefore withstand cracking in the support patterns.

10 Claims, 6 Drawing Sheets

U.S. PATENT DOCUMENTS

| | | | |
|---|---|---|---|
| 7,316,973 B2 | 1/2008 | Roh | |
| 7,329,918 B2 | 2/2008 | Cho et al. | |
| 7,332,393 B2 | 2/2008 | Lee et al. | |
| 7,410,892 B2 * | 8/2008 | Park et al. | 438/598 |
| 7,436,066 B2 | 10/2008 | Sonobe et al. | |
| 7,488,665 B2 | 2/2009 | Agarwal et al. | |
| 7,507,657 B2 * | 3/2009 | Ryu et al. | 438/633 |
| 7,517,753 B2 | 4/2009 | Manning | |
| 7,547,598 B2 | 6/2009 | Choi | |
| 7,582,925 B2 | 9/2009 | Jung et al. | |
| 7,670,903 B2 | 3/2010 | Park et al. | |
| 7,700,469 B2 | 4/2010 | Benson | |
| 7,736,965 B2 | 6/2010 | Cheng et al. | |
| 7,781,818 B2 | 8/2010 | Manning et al. | |
| 2004/0145057 A1 | 7/2004 | Choi | |
| 2004/0217407 A1 | 11/2004 | Cho et al. | |
| 2004/0227175 A1 | 11/2004 | Iijima et al. | |
| 2007/0134872 A1 | 6/2007 | Sandhu et al. | |
| 2007/0267676 A1 | 11/2007 | Kim et al. | |
| 2009/0004808 A1 | 1/2009 | Lee et al. | |
| 2010/0151653 A1 | 6/2010 | Bhat et al. | |

FOREIGN PATENT DOCUMENTS

| | | |
|---|---|---|
| KR | 1020050019301 A | 3/2005 |
| KR | 1020050059697 A | 6/2005 |
| KR | 1020070086929 A | 8/2007 |

OTHER PUBLICATIONS

USPTO FOA mailed Jul. 8, 2010 in connection with U.S. Appl. No. 12/169,708.

USPTO OA mailed Oct. 20, 2010 in connection with U.S. Appl. No. 12/169,708.

USPTO NOA mailed Mar. 29, 2011 in connection with U.S. Appl. No. 12/169,708.

* cited by examiner

SEMICONDUCTOR DEVICE FOR PREVENTING THE LEANING OF STORAGE NODES AND METHOD FOR MANUFACTURING THE SAME

CROSS-REFERENCE TO RELATED APPLICATIONS

The present application claims priority to Korean patent application number 10-2008-0039941 filed on Apr. 29, 2008, which is incorporated herein by reference in its entirety.

BACKGROUND OF THE INVENTION

The present invention relates to a semiconductor device and a method for manufacturing the same, and more particularly, to a semiconductor device that prevents storage nodes from leaning and cracks from occurring in support patterns and a method for is manufacturing the same.

The rapid increase in demand for semiconductor memory devices has lead to various attempts to develop techniques for obtaining a high capacitance capacitor. Typical capacitors have a structure in which a dielectric layer is interposed between storage nodes and plate nodes. The capacitance of the capacitor is directly proportional to the surface area of an electrode and the dielectric constant of the dielectric layer and is inversely proportional to the distance between electrodes, i.e., the thickness of the dielectric layer.

Therefore, in order to obtain a capacitor having a high capacitance, it is necessary to use a dielectric layer having a high dielectric constant, increase the surface area of an electrode, or decrease the distance between electrodes. From among these methods, decreasing the distance between electrodes, i.e., the thickness of the dielectric layer, is limited. Therefore, research for forming a capacitor having a high capacitance is primarily directed toward using a dielectric layer having high dielectric constant or increasing the surface area of an electrode by increasing the height of the capacitor.

A conventional method for increasing the surface area of an electrode forms a capacitor as a concave type or a cylinder type. In comparing the two types, the cylinder type capacitor has a wide surface area of an electrode when compared to the concave type capacitor because the inner surface and the outer surface of a storage node can be utilized as the surface area of an electrode. Therefore, the cylinder type capacitor may be advantageously applied to a highly integrated semiconductor device.

In order to form the cylinder type capacitor, a dip-out process for removing a mold insulation layer, which served as a mold for forming storage nodes, should be conducted. Considering the size of a cell is decreasing in order to accommodate the trend toward highly integrated semiconductor devices, the aspect ratio of the storage nodes increases and the gap between the storage nodes becomes narrow as a result. Due to the increasing aspect ration and the narrowing gap, the storage nodes are likely to lean when conducting the dip-out process. In order to overcome this drawback, a method for forming support patterns to fix the storage nodes has been suggested in the art.

Nevertheless, in the conventional art, cracks are likely to occur in support patterns due to the high tensile stress (ranging $1 \times 10^9$~$1 \times 10^{10}$ dyne/cm$^2$) of a nitride layer used under a low-pressure condition to form the support patterns. As a result, a dielectric layer may not be uniformly formed where the cracks occur when subsequently forming the dielectric layer. Because of this, in the conventional art, the voltage discharge characteristic of the capacitor is deteriorated and leakage capacitance occurs, whereby the characteristics and reliability of a semiconductor device can be is degraded as a result.

SUMMARY OF THE INVENTION

Embodiments of the present invention include a semiconductor device which can prevent storage nodes from leaning, and a method for manufacturing the same.

Embodiments of the present invention also include a semiconductor device that can prevent cracks from occurring in support patterns, and a method for manufacturing the same.

In one embodiment of the present invention, a semiconductor device includes support patterns that are formed to support a plurality of cylinder type storage nodes, wherein the support patterns comprise a BN layer.

The BN layer has a thickness of 100~300 Å.

In another embodiment of the present invention, a method for manufacturing a semiconductor device comprises the steps of forming an insulation layer on a semiconductor substrate; forming a BN layer on the insulation layer; etching the BN layer and the insulation layer and thereby defining a plurality of holes; forming to cylinder type storage nodes in the respective holes; etching the BN layer and thereby forming support patterns which support the cylinder type storage nodes and comprise the BN layer; and removing the insulation layer which remains after formation of the support patterns.

After the step of forming the insulation layer and before the step of forming the BN layer on the insulation layer, the method further comprises the step of performing the planarization for a surface of the insulation layer.

The planarization is performed by CMP.

The BN layer is formed through a thermal CVD process.

The thermal CVD process is conducted using $B_3N_3H_6$ gas as source gas.

The thermal CVD process is conducted at a temperature of 400~720° C. under pressure of 4~10 Pa.

The BN layer is formed to have a thickness of 100~300 Å.

The step of forming the support patterns comprises the steps of forming a capping layer on the storage nodes and the BN layer; forming a mask pattern which will be used for forming the support patterns, on the capping layer; etching the capping layer using the mask pattern as an etch mask to expose the BN layer; etching exposed portions of the BN layer; removing the mask pattern; and removing the capping layer.

The capping layer is formed as an oxide layer.

The oxide layer comprises a PE-TEOS layer.

DESCRIPTION OF SPECIFIC EMBODIMENTS

Hereafter, specific embodiments of the present invention will be described with reference to the attached drawings.

Figure 1:
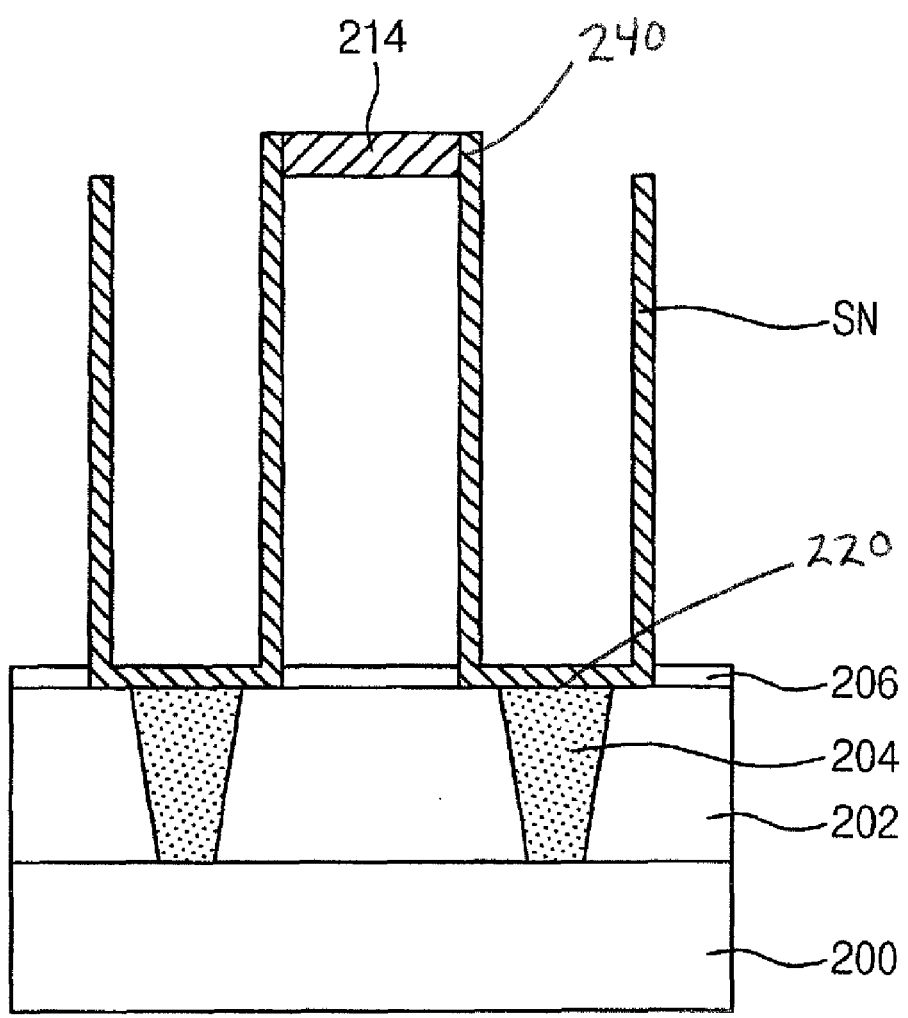
FIG. 1 is a cross-sectional view showing a semiconductor device in accordance with one embodiment of the present invention.

FIG. 1 is a cross-sectional view showing a semiconductor device in accordance with a first embodiment of the present invention.

Referring to FIG. 1, an interlayer dielectric 202 is formed on a semiconductor substrate 200, and storage node contact plugs 204 are formed in the interlayer dielectric 202. A plurality of cylinder type storage nodes SN are formed on the storage node contact plugs 204 located in the interlayer dielectric 202. The lower portions 220 of the cylinder type storage nodes SN are formed on the storage node contact plugs 204. Support patterns 214 are formed on the resultant semiconductor substrate 200 formed with the storage node contact plugs 204 and the storage nodes SN to support the storage nodes SN. As shown in FIG. 1, the support patterns 214 are formed on the upper portions 230 of the storage nodes. The support patterns 214 comprise a BN (boron nitride) layer having a hexagonal structure and having a thickness in the range of 100~300 Å.

That is to say, the semiconductor device according to the first embodiment of the present invention includes support patterns 214 to support the cylinder type storage nodes SN. Accordingly, in the present invention, it is possible to prevent the storage nodes SN from leaning.

The support patterns 214 have compressive stress (ranging to $-1 \times 10^8 \sim 0$ dyne/cm$^2$) due to the fact that the support patterns 214 are comprised of the BN layer and having a hexagonal structure. As a result, in the present invention, it is possible to prevent cracks from occurring in the support patterns due to tensile stress.

Consequently, in the present invention, it is possible to suppress leakage capacitance from occurring where cracks occur. Suppressing leakage capacitance from occurring effectively improves the characteristics and reliability of a semiconductor device.

FIGS. 2A through 2J are sectional views illustrating the processes for a method of manufacturing a semiconductor device in accordance with a second embodiment of the present invention.

Figure 2A:
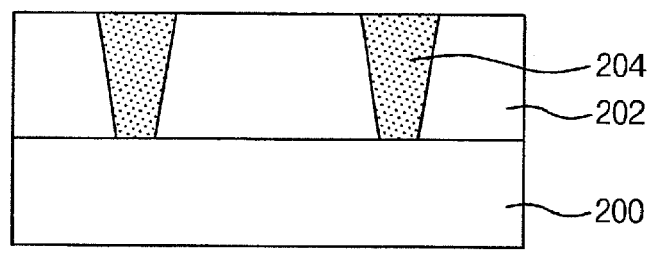
FIGS. 2A through 2J are cross-sectional views showing the processes of a method for manufacturing a semiconductor device in accordance with another embodiment of the present invention.

Referring to FIG. 2A, an interlayer dielectric 202 is formed on a semiconductor substrate 200. Contact holes are then defined by etching the interlayer dielectric 202. A conductive layer, e.g., a polysilicon layer, is formed on the interlayer dielectric 202 filling the contact holes. Storage node contact plugs 204 are formed in the is contact holes by etching back and removing the portion of the conductive layer formed on the interlayer dielectric 202 until the interlayer dielectric 202 is exposed.

Figure 2B:
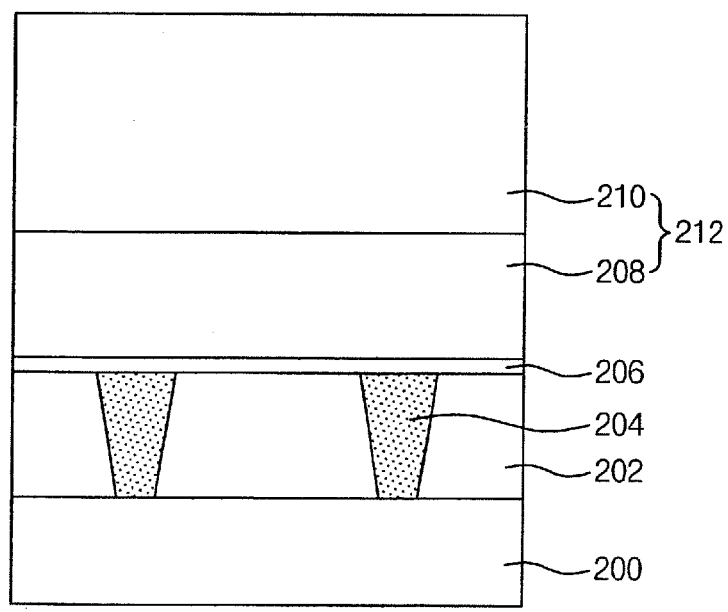

Referring to FIG. 2B, an etch stop layer 206 is formed on the storage node contact plugs 204 and the interlayer dielectric 202. An insulation layer 212 is then formed on the etch stop layer 206. The etch stop layer 206 is formed of a nitride layer and the insulation layer 212 is formed as a stacked structure of a PSG (phosphosilicate glass) layer 208 and a PE-TEOS (plasma-enhanced tetraethyl orthosilicate) layer 210. The PSG layer 208 is formed having a thickness in the range of 3,000~5,000 Å, and the PE-TEOS layer 210 is formed having a thickness in the range of 1,000~14,000 Å. A CMP (chemical mechanical polishing) process is subsequently conducted on the surface of the PE-TEOS layer 210. The CMP process is conducted in order to polish the PE-TEOS layer 210 by 1,000 Å.

Figure 2C:
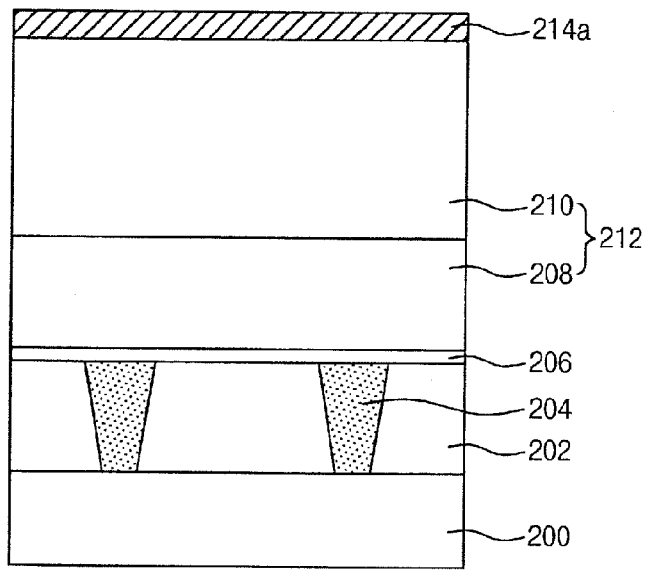

Referring to FIG. 2C, a BN layer 214a is formed on the insulation layer 212, i.e., on the PE-TEOS layer 210, and serves as a support layer for supporting storage nodes when a dip-out process is subsequently performed. The BN layer 214a is formed via a thermal CVD (chemical vapor deposition) process having a thickness in the range of 100~300 Å and having a hexagonal structure. The thermal CVD process is conducted using, e.g., $B_3N_3H_6$ gas, as a source gas at a temperature in the range of is 100~720° C. under a pressure in the range of 4~10 Pa.

Figure 2D:
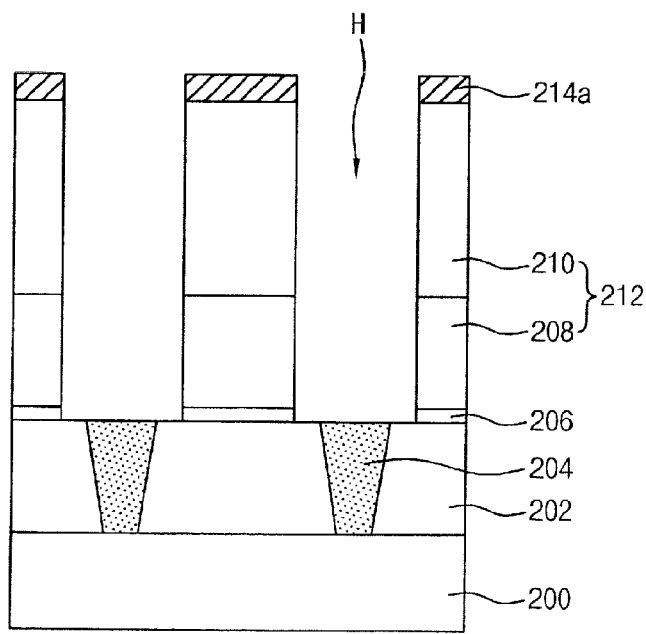

Referring to FIG. 2D, a plurality of holes H for forming storage nodes are defined. The plurality of holes H are formed by etching the BN layer 214a, the insulation layer 212, and the etch stop layer 206 to expose the storage node contact plugs 204 in the interlayer dielectric 202.

Figure 2E:
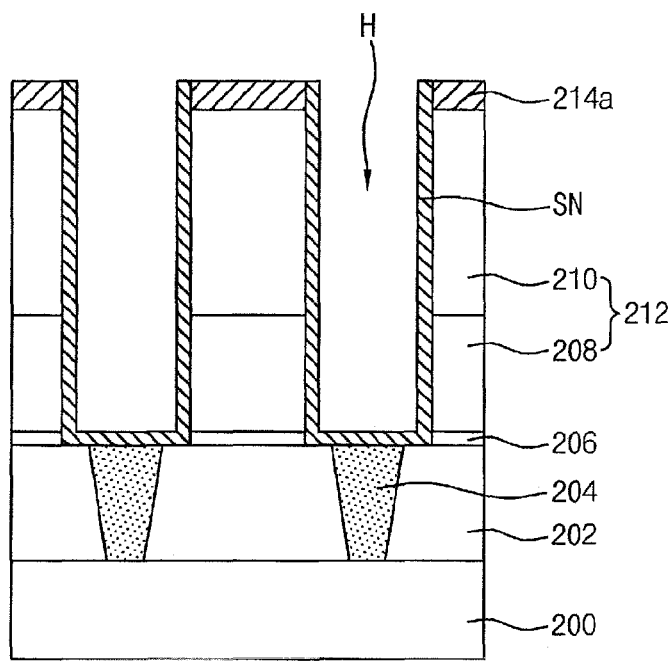

Referring to FIG. 2E, a conductive layer for storage nodes is formed on the BN layer 214a and the inner surface of the holes H. The conductive layer for storage nodes is formed of a TiN layer. The TiN layer is formed using TiCl$_4$ gas as a source gas.

Cylinder type storage nodes SN are then formed on the surfaces of the holes H by removing a portion of the conductive layer for storage nodes formed on the BN layer 214a via a CMP process or an etch-back process.

Figure 2F:
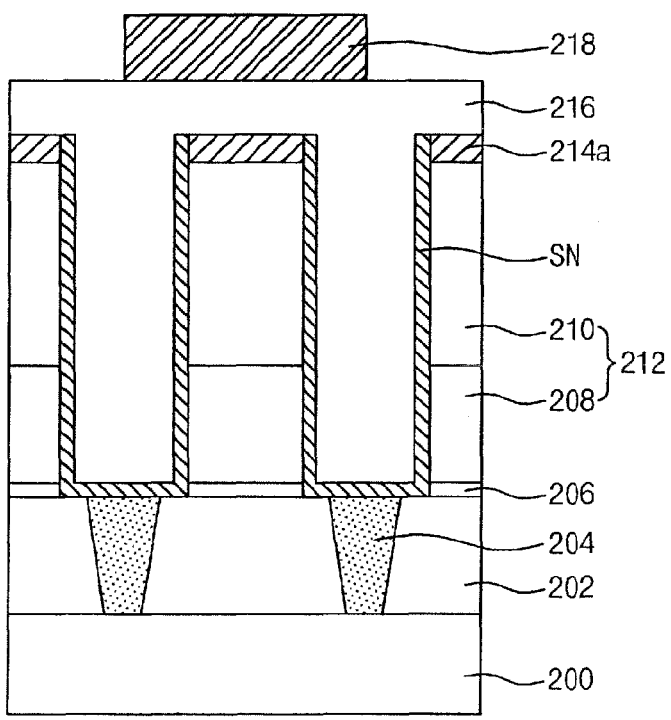

Referring to FIG. 2F, a capping layer 216 is formed on the BN layer 214a and fills the storage nodes SN. The capping layer 216 is formed of an oxide layer, e.g., a PE-TEOS layer, having a thickness in the range of 1,000~1,600 Å capable of preventing oxidation of the storage nodes SN. A mask pattern 218, which will to be used when forming support patterns for supporting the storage nodes SN, is formed on the capping layer 216. The mask pattern 218 is formed, e.g., of a photoresist layer.

Figure 2G:
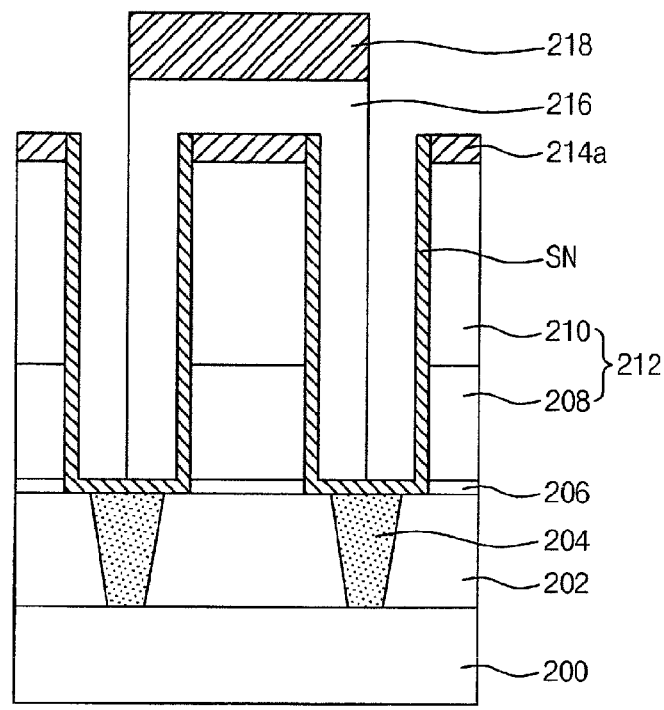

Referring to FIG. 2G, the capping layer 216 is etched using the mask pattern 218 as an etch mask. Etching of the capping layer 216 is conducted such that the BN layer 214a is exposed.

Figure 2H:
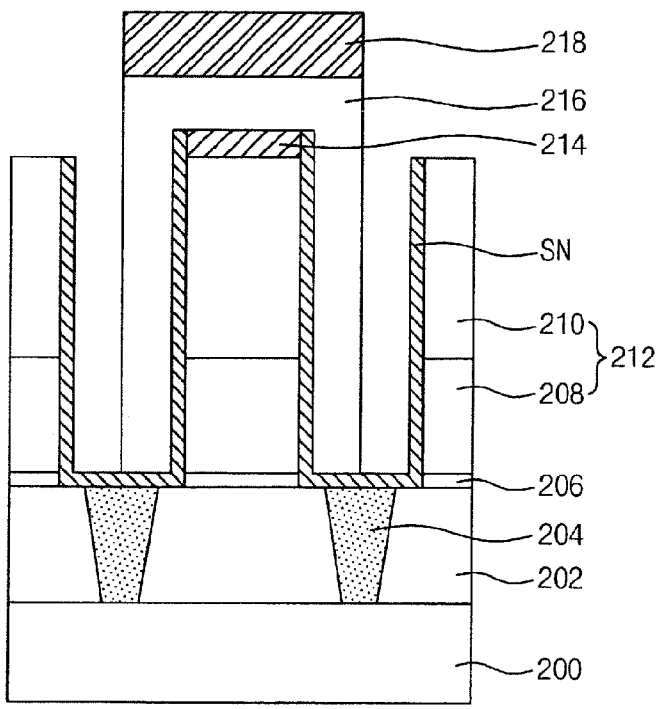

Referring to FIG. 2H, support patterns 214 are formed to support adjoining storage nodes SN by etching the remaining exposed BN layer 214a. When etching the BN layer 214a, portions of the storage nodes SN sidewalls adjacent to the BN layer 214a are etched.

Figure 2I:
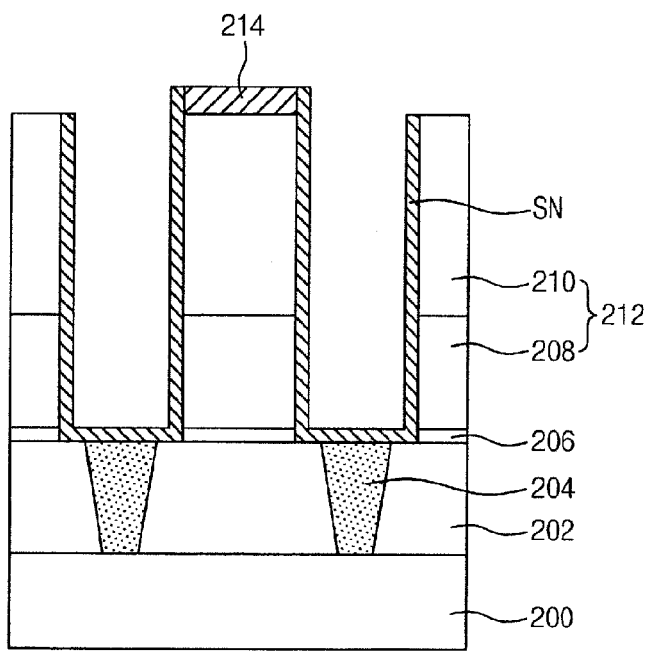

Referring to FIG. 2I, the capping layer 216 is removed after removing the mask pattern 218 from the resultant structure formed with the support patterns 214.

Figure 2J:
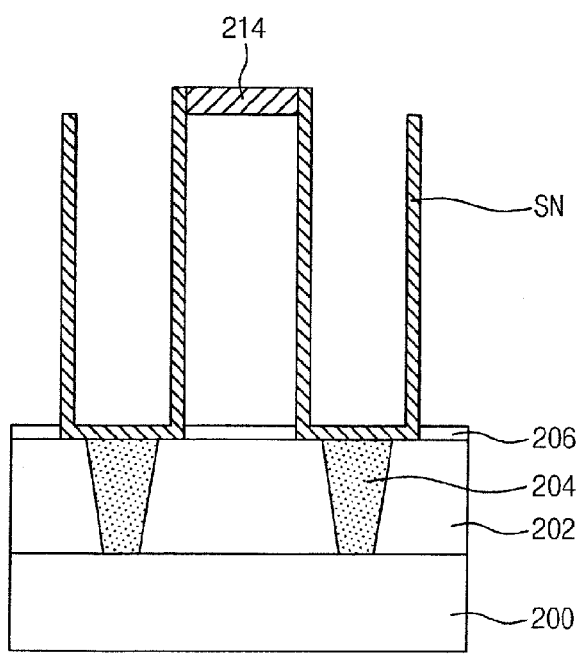

Referring to FIG. 2J, the insulation layer 212 remaining after the formation of the support patterns 214 is removed. Removal of the insulation layer 212 is conducted via a wet type dip-out process. When conducting the wet type dip-out process, any remaining portion of the capping layer 216 that is not completely removed during the previous removal process can be removed altogether along with the removal of the insulation layer 212.

Thereafter, while not shown in the drawings, the manufacture of the semiconductor device according to the second embodiment of the present invention is completed after forming a dielectric layer and plate nodes on the storage nodes SN including the support patterns 214 by sequentially conducting a series of well-known subsequent processes.

As is apparent from the above description, according to the present invention, support patterns for supporting storage nodes are formed and comprise a BN layer having a hexagonal structure. The BN layer having the hexagonal structure has a large etching selectivity with respect to an oxide layer and an insulation layer. More specifically, the etching selectivity between the oxide layer and insulation layer, and the BN layer is 10:1 or greater.

Therefore, the support patterns comprising the BN layer having the hexagonal structure are not etched when conducting a dip-out process for removing the insulation layer that served as a mold during the formation of the storage nodes. Accordingly, in the present invention, it is possible to prevent the storage nodes from leaning by fixing the storage nodes using the support patterns.

Further, the BN layer having the hexagonal structure is a layer having compressive stress as opposed to tensile stress. Thus, in the present invention, it is possible to prevent cracks from occurring due to the support patterns having tensile stress as in the conventional art. Accordingly, in the present invention, leakage capacitance caused where cracks occur as in the conventional art, can be suppressed, thereby improving a discharge voltage characteristic.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, comprising the steps of:
    forming an insulation layer on a semiconductor substrate;
    forming a layer formed of BN having a hexagonal lattice structure on the insulation layer;
    etching the layer formed of BN having a hexagonal lattice structure and the insulation layer to expose the semiconductor substrate and form a plurality of holes;
    forming cylinder type storage nodes in the respective holes;
    etching a portion of the layer formed of BN having a hexagonal lattice structure to form support patterns between the cylinder type storage nodes to support the storage nodes; and
    removing the insulation layer remaining after formation of the support patterns.

2. The method according to claim 1, wherein, after the step of forming the insulation layer and before the step of forming the layer formed of BN having a hexagonal lattice structure on the insulation layer, the method further comprises the step of:
    performing planarization of a surface of the insulation layer.

3. The method according to claim 2, wherein the planarization is performed using a chemical mechanical polishing (CMP) process.

4. The method according to claim 1, wherein the layer formed of BN having a hexagonal lattice structure is formed using a thermal chemical vapor deposition (CVD) process.

5. The method according to claim 4, wherein the thermal CVD process is conducted using $B_3N_3H_5$ gas as a source gas.

6. The method according to claim 4, wherein the thermal CVD process is conducted at a temperature in the range of 400~720° C. and under a pressure in the range of 4~10 Pa.

7. The method according to claim 1, wherein the layer formed of BN having a hexagonal lattice structure is formed to have a thickness in the range of 100~300 Å.

8. The method according to claim 1, wherein the step of forming the support patterns comprises the steps of:
    forming a capping layer on the cylinder type storage nodes and the layer formed of BN having a hexagonal lattice structure;
    forming a mask pattern used in forming the support patterns on a portion of the capping layer;
    etching the capping layer using the mask pattern as an etch mask to expose the layer formed of BN having a hexagonal lattice structure;
    etching exposed portions of the layer formed of BN having a hexagonal lattice structure;
    removing the mask pattern; and
    removing the capping layer.

9. The method according to claim 8, wherein the capping layer is formed of an oxide layer.

10. The method according to claim 9, wherein the oxide layer comprises a PE-TEOS layer.

* * * * *